US011821946B2

(12) United States Patent
Corso Sarmiento et al.

(10) Patent No.: US 11,821,946 B2
(45) Date of Patent: Nov. 21, 2023

(54) BUILT IN SELF TEST (BIST) FOR CLOCK GENERATION CIRCUITRY

(71) Applicant: NXP USA, Inc., Austin, TX (US)

(72) Inventors: Jorge Arturo Corso Sarmiento, Austin, TX (US); Anurag Jindal, Austin, TX (US)

(73) Assignee: NXP USA, Inc., Austin, TX (US)

( * ) Notice: Subject to any disclaimer, the term of this patent is extended or adjusted under 35 U.S.C. 154(b) by 72 days.

(21) Appl. No.: 17/447,743

(22) Filed: Sep. 15, 2021

(65) Prior Publication Data

US 2023/0079000 A1    Mar. 16, 2023

(51) Int. Cl.
| | |
|---|---|
| G01R 31/317 | (2006.01) |
| G01R 31/3177 | (2006.01) |
| G01R 31/3185 | (2006.01) |
| G01R 31/3187 | (2006.01) |
| G01R 31/319 | (2006.01) |
| G06F 1/10 | (2006.01) |
| G06F 1/08 | (2006.01) |
| G06F 11/27 | (2006.01) |
| G06F 1/06 | (2006.01) |

(52) U.S. Cl.
CPC ... *G01R 31/31727* (2013.01); *G01R 31/3177* (2013.01); *G01R 31/3187* (2013.01); *G01R 31/318552* (2013.01); *G01R 31/31724* (2013.01); *G01R 31/31725* (2013.01); *G01R 31/31922* (2013.01); *G01R 31/318594* (2013.01); *G06F 1/06* (2013.01); *G06F 1/08* (2013.01); *G06F 1/10* (2013.01); *G06F 11/27* (2013.01)

(58) Field of Classification Search
CPC ... G06F 11/27; G06F 1/08; G06F 1/10; G06F 1/06; G01R 31/3177; G01R 31/31727; G01R 31/31724; G01R 31/3187; G01R 31/318552; G01R 31/31922; G01R 31/31725; G01R 31/318594
See application file for complete search history.

(56) References Cited

U.S. PATENT DOCUMENTS

| | | |
|---|---|---|
| 6,442,722 B1 | 8/2002 | Nadeau-Dostie et al. |
| 9,298,572 B2 | 3/2016 | Ahmed et al. |
| 2006/0190781 A1 | 8/2006 | Farmer et al. |

(Continued)

FOREIGN PATENT DOCUMENTS

| | | |
|---|---|---|
| DE | 602005005084 T2 | 3/2009 |
| JP | WO2012035651 A1 | 3/2012 |

*Primary Examiner* — April Y Blair
*Assistant Examiner* — Sazzad Hossain (57) ABSTRACT

Testing clock division circuitry includes generating pseudo random test pattern bits for scan chain logic in programmable clock division logic circuitry and divided clock counter circuitry. A shift clock is used to shift the test pattern bits into the scan chain logic. A capture clock signal is used in the programmable clock division logic during a non-test mode of operation. The shift clock is used to provide output shift bits from the scan chain logic to a multi-input shift register (MISR). Once all the output shift bits for the test pattern bits are provided to the MISR, a final test signature from the MISR is compared to an expected test signature to determine whether the programmable clock division logic circuitry and divided clock counter circuitry are free of faults.

20 Claims, 2 Drawing Sheets

(56) References Cited

U.S. PATENT DOCUMENTS

| | | | |
|---|---|---|---|
| 2011/0296266 A1* | 12/2011 | Song | G06F 11/2242 |
| | | | 713/400 |
| 2014/0208175 A1 | 7/2014 | Kumar et al. | |
| 2015/0052411 A1 | 2/2015 | Cesari | |
| 2015/0185285 A1* | 7/2015 | Kovalev | G01R 31/318572 |
| | | | 714/727 |
| 2015/0219717 A1* | 8/2015 | Ahrens | G01R 31/318547 |
| | | | 714/727 |
| 2016/0169966 A1 | 6/2016 | Abshishek et al. | |
| 2018/0284192 A1 | 10/2018 | Kumar et al. | |
| 2020/0355744 A1* | 11/2020 | Narayanan | G01R 31/318552 |

\* cited by examiner

BUILT IN SELF TEST (BIST) FOR CLOCK GENERATION CIRCUITRY

BACKGROUND

Field

This disclosure relates generally to integrated circuits, and more specifically, to Built In Self Test (BIST) for clock generation circuitry.

Related Art

In integrated circuit designs, it is desirable to achieve higher test coverage targets which results in higher quality devices. Currently, it is difficult to achieve sufficient coverage for clock generation logic, due, for example, to lack of observation. Also, regular Automatic Test Pattern Generation (ATPG) and logic BIST for clock generation are typically insufficient due to the lack of controllability and observability of the source clocks and the generated clocks. Therefore, a need exists for improved BIST for clock generation so as to achieve greater test coverage.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, BIST circuitry provides for improved test coverage for clock generation circuitry. In one embodiment, the BIST circuitry uses scan chains which are fed pseudo-random test patterns during scan testing. For example, these scan chains can be constituted by the configuration registers of the clock generation circuitry and clock counters used for observing and validating various signals within the clock generation circuitry. For scan testing, the BIST circuitry alternates between scan shift phases and capture phases to generate a test signature. In one embodiment, the configuration of the clock generation circuitry is defined during the scan shift phases by the random values shifted into the scan chains of the configuration registers, and the capture phases of the scan test are each based on a deterministic number of capture clock pulses that are fed to the clock generation circuitry. Further, the use of various clock gating elements and MUXes provide for smooth transition between scan and capture phases. With this improved scan testing, improved deterministic fault coverage may be obtained.

Figure 1:
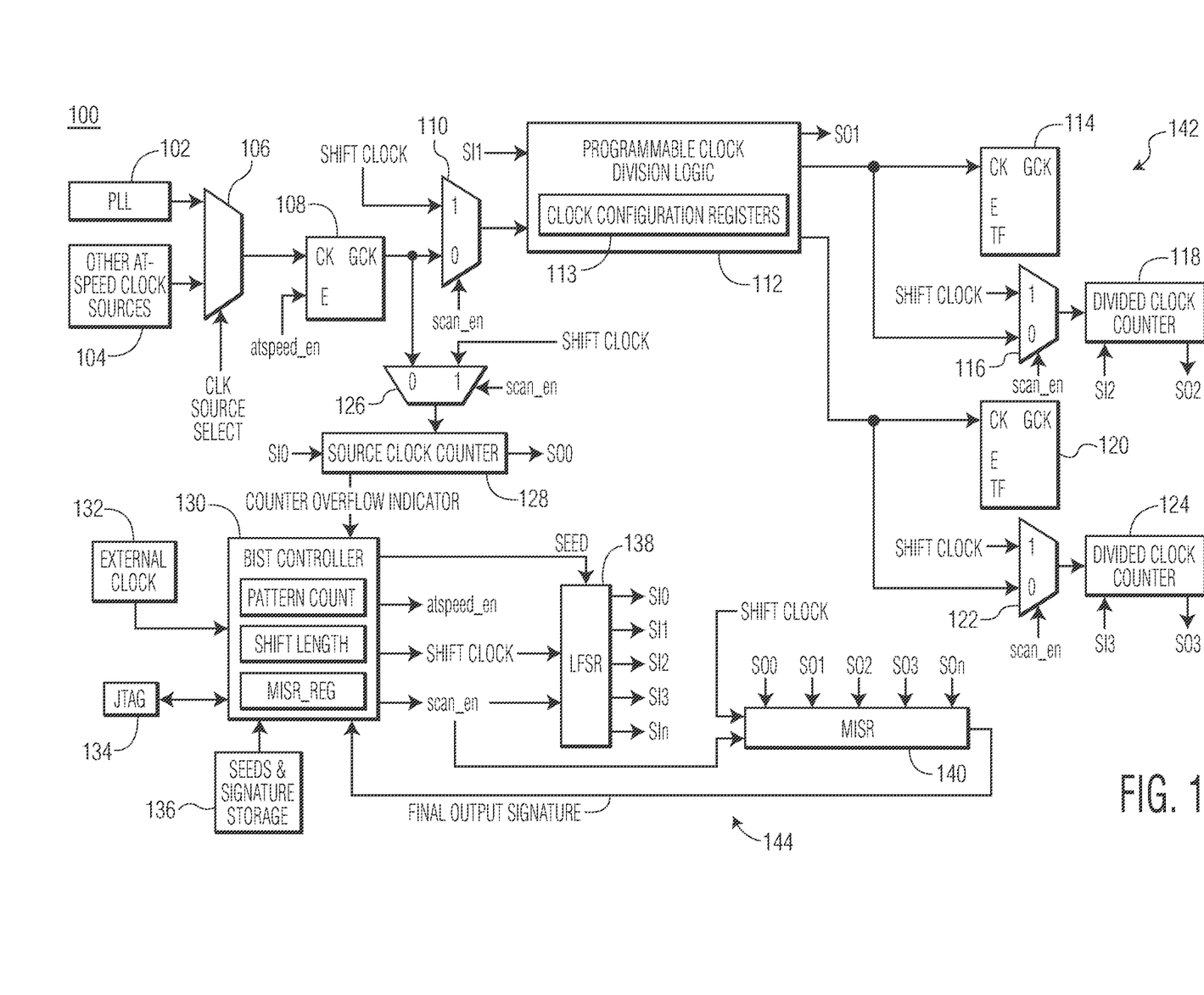
FIG. 1 illustrates, in block diagram form, an integrated circuit having clock generation circuitry and built in self test (BIST) circuitry, in accordance with one embodiment of the present invention.

FIG. 1 illustrates an integrated circuit (IC) 100, in accordance with one embodiment of the present invention. IC 100 may be a System-on-Chip (SoC), and thus may also be referred to as SoC 100. IC 100 includes both clock generation circuitry 142 and BIST circuitry 144. Clock generation circuitry 142 includes a Phase Locked Loop (PLL) 102 and other at-speed clock sources 104, a multiplexer (MUX) 106, programmable clock division logic 112 (which includes clock configuration registers 113 and may also be referred to as programmable clock division logic circuitry), and clock gating elements 114 and 120. BIST circuitry 144 includes a BIST controller 130, clock gating element 108, MUXes 110, 126, 116, and 122, a source clock counter 128, divided clock counters 118 and 124, a Linear Feedback shift Register (LFSR) 138, a Multiple Input Signature Register (MISR) 140, and storage circuitry 136 configured to store seeds and corresponding expected signatures. BIST controller has a test port 134 (e.g. a Joint Test Action Group (JTAG) port) and can be coupled to an external clock 132.

A clock output of PLL 102 is coupled to a first input of MUX 106, and outputs of other at-speed clock sources can be provided as other inputs to MUX 106. Therefore, MUX 106 may include any number of data inputs, in which one of the data inputs is selected by the clk source select signal to be provided as the output of MUX 106. The output of MUX 106 is provided to a clock input, CK, of clock gating element 108 and a control signal, atspeed_en, is provided to an enable control input, E, of clock gating element 108. When the input to the enable input E is asserted (i.e. when atspeed_en is asserted to a logic level one), the input at CK is provided as the output clock signal, GCK, of clock gating element 108. However, while the enable input E is negated (i.e. when atspeed_en is negated to a logic level zero), the output clock signal, GCK, is provided as a logic level low, thus gating the input clock at CK such that the input clock is not provided as GCK. A first data input of MUX 110 is coupled to receive an shift clock, and a second data input of MUX 110 is coupled to receive the output clock signal, GCK, from clock gating element 108. One of the shift clock or the output clock signal from clock gating element 108 is provided as the source clock to an input of programmable clock division logic 112, based on a scan enable signal, scan_en.

In one embodiment, clock configuration registers 113 within programmable clock division logic 112 are configured as a scan chain for use during scan testing such that an input bit of a first element of the scan chain receives SI1 during scan and an output bit from the last element of the scan chain provides SO1. When scan_en is asserted to a logic level one, the shift clock is selected by MUX 110 in order to scan test bits into and out of the scan chain for scan testing, and when scan_en is negated to a logic level zero, the selected source clock at the output of clock gating element 108 is provided as the input source clock to programmable clock division logic 112. In the illustrated embodiment, programmable clock division logic provides any number of divided clock outputs in which each divided clock output is coupled to a clock input of a corresponding clock gating element, such as clock gating elements 114 and 120. Further details on the scan chain of programmable clock division logic 112 will be discussed below, in which the scan chain receives an input bit SI1 and provides an output bit SO1.

A first data input of MUX 126 is coupled to also receive the shift clock, and a second data input of MUX 126 is coupled to the clock output, GCK, of clock gating element 108. A control input of MUX 126 is coupled to receive scan_en, and an output of MUX 126 is provided to an input of source clock counter 128. When scan_en is asserted to a logic level one, the shift clock is provided to source clock counter 128 and when negated to a logic level zero, GCK of clock gating element 108 is provided to source clock counter 128, in which source clock counter 128 increments its count value by one with each clock pulse received at its input.

Source clock counter also includes a load input coupled to receive a load value from which source clock counter 128 starts counting (i.e. an initial count value). In the illustrated embodiment, the elements which receive the load value are configured as a scan chain in which an input bit of the scan chain receives SI0 and an output bit provides SO0. Source clock counter also provides a counter overflow indicator to BIST controller 130, which, when asserted to a logic level one, indicates that the count value of counter 128 has surpassed its maximum count value.

First data inputs of MUXes 116 and 120 each receive the shift clock, and second data inputs of MUXes 116 and 120 receive a corresponding divided clock output from programmable clock division logic 112. An output of MUX 116 is provided a clock input to divided clock counter 118, and an output of MUX 120 is provided as a clock input to divided clock counter 124. Control inputs of MUXes 116 and 120 receive scan_en, such that when scan_en is asserted to a logic level one the shift clock is provided to each of divided clock counters 118 and 124, and when scan_en is negated to a logic level zero, the corresponding divided clock output is provided to divided clock counters 118 and 124. As with source clock counter 128, each of the divided clock counters include a load input coupled to receive a load value from which each counter starts counting (i.e. an initial count value). In the illustrated embodiment, the elements which receive the load value are configured as a scan chain in which an input bit of the scan chain of counter 118 receives SI2 and an input bit of the scan chain of counter 120 receives SI3. An output bit of the scan chain of counter 118 provides SO2, and an output bit of the scan chain of counter 120 provides SO3.

BIST controller 130 includes circuitry to control scan testing of the clock generation circuitry. BIST controller 130 also includes one or more registers or storage circuitry configured to store a pattern count, a shift length, and a MISR signature value (MISR_reg). BIST controller 130 is coupled to receive external clock 132 and incudes a test port 134. In one embodiment, the one or more registers of BIST controller 130 are programmed via test port 134. The control circuitry of BIST controller 130 provides a seed value to LFSR 138, provides the atspeed_en signal, the shift clock, and the scan_en signal. In one embodiment, the control circuitry of BIST controller 130 can be implemented as a state machine. LFSR 138 receives the shift clock, the seed value, and scan_en, and provides scan input bits SI0-SIn. MISR 140 receives the shift clock, scan_en, and receives scan output bits SO-SOn. MISR 140 also provides a final output signature to BIST controller 130 for storage into the MISR_reg. Storage circuitry 136, which may be located within IC 100 or external to IC 100, stores seed values for the LFSR and corresponding expected signatures from the MISR. Therefore, storage circuitry 136 can provide seed values needed by BIST controller 130 to provide to LFSR 138 and can provide corresponding expected signatures such that BIST controller 130 may compare values in the MISR_reg to corresponding expected signature values.

As illustrated in FIG. 1, clock generation circuitry 142 along with BIST circuitry 144 include four scan chains (S0-S3, in which S0 receives SI0 as an input and provides SO0 as an output, S1 receives SI1 as an input and provides SO1 as an output, S2 receives S21 as an input and provides SO2 as an output, and S3 receives SI3 as an input and provides SO3 as an output). Clock generation circuitry 142 and BIST circuitry 144 may include additional scan chains, and additional scan chains may also be located elsewhere in IC 100. In the illustrated embodiment, LFSR 138 operates as a pseudo random number generator, which generates pseudo random numbers based on a received seed value. In the illustrated embodiment, LFSR 138 receives a seed from BIST controller 130 and generates an (n+1)-bit pseudo random number, SI0-SIn, which is provided as inputs to n+1 scan chains. MISR 140 receives input bits in parallel and calculates a new signature based on the previous signature and newly received input bits. In the illustrated embodiment, MISR 140 receives (n+1) bits, SO0-SOn, corresponding to outputs of the n+1 scan chains. Note that n can be any integer value greater or equal to one, and, due to how a MISR operates, each signature from MISR 140 may be referred to as a compressed version of a scan test signature. The seeds provided by BIST controller 130 to LFSR 138 may be stored in storage circuitry 136.

For scan testing, with each seed provided to LFSR 138, a pattern having a shift length amount of bits is scanned into each scan chain in parallel. For example, if the shift length for the pattern is 100, then each of SI0-Sin provides 100 bits, each corresponding to a pseudo random number generated by LFSR 138 in accordance with the shift clock. Therefore, with each pulse of the shift clock a next bit of the pattern is provided on each of SI0-SIn, and the bits in the scan chain are shifted in one bit further. With each shift clock, note also that one bit is shifted out of the scan chains and provided as SO0-SOn to MISR 140, in which MISR 140 recalculates its signature. Further details of the scan testing will be described in reference to the flow diagram of FIG. 2 below.

During functional operation of IC 100, clock generation circuitry 142 receives a source clock (e.g. PLL 102 or other at-speed clock sources 104) and generates various clocks for use in IC 100. During functional operation, atspeed_en is negated so that the output of MUX 106 is provided at the output, GCK, of clock gating element 108, and scan_en is negated such that the second input of MUX 110 is selected. In this manner, the selected source clock from MUX 106 is provided, via clock gating element 108 and MUX 110, as an input to programmable division logic 112. Clock configuration registers 113 can be programmed to generate different divided clocks based on the input source clock. For example, these may include a clock whose frequency is the frequency of the source clock divided by four, divided by two, etc. These divided clocks may be provided by various outputs of programmable clock division logic 112 to IC 100 via corresponding clock gating elements 114 and 120. Each of clock gating elements 114 can be controlled (via its enable control input, E) to either provide the received divided clock at its output to portions of IC 100 or gate the divided clock at its output so that it is not provided to portions of IC 100. During functional operation, BIST circuitry 144 is not used (except to negate scan_en and atspeed_en). However, functional operation can be temporarily stopped or paused to allow BIST circuitry 144 to perform scan testing of the clock generation circuitry.

Figure 2:
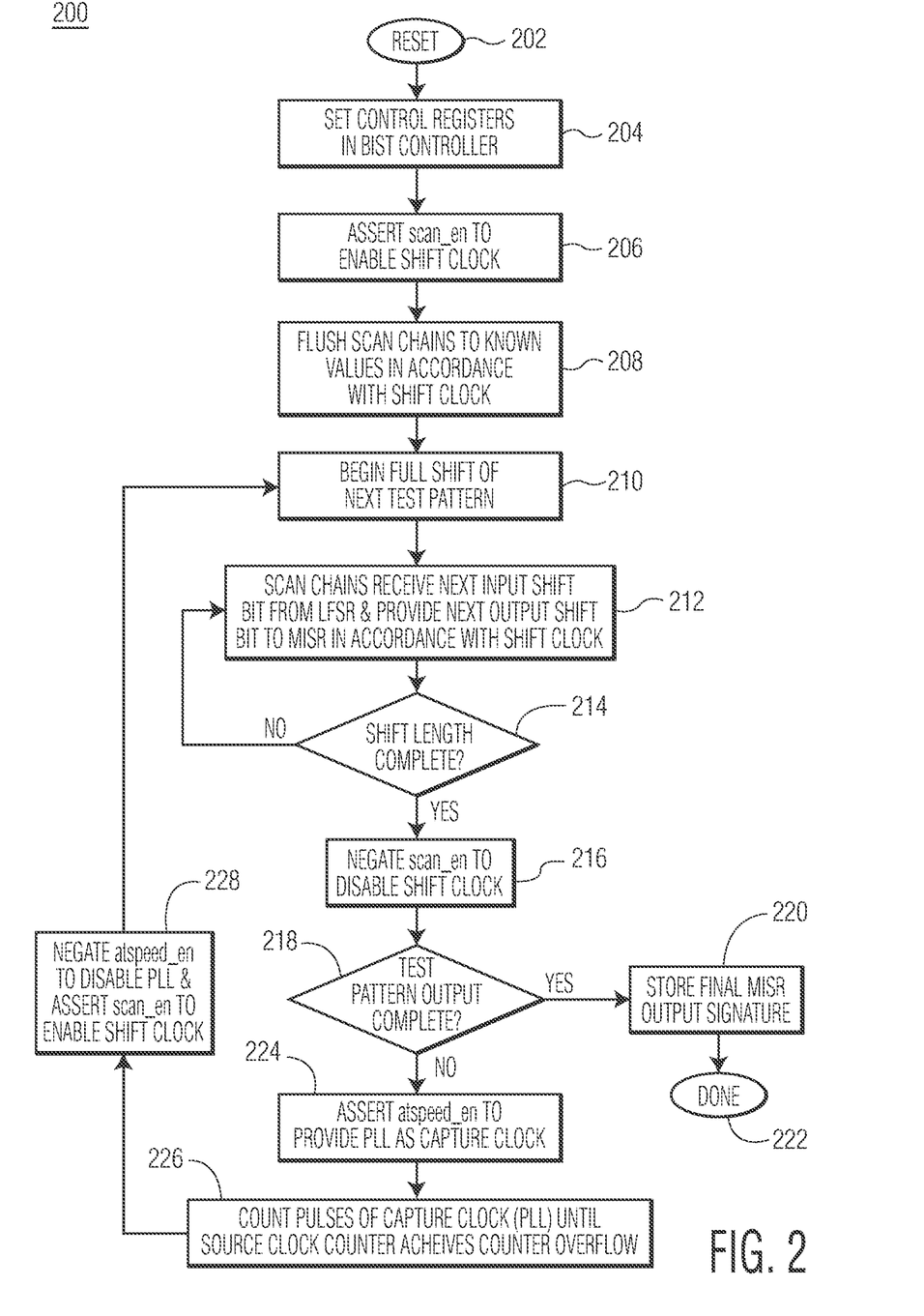
FIG. 2 illustrates, in flow diagram form, a method of operating the BIST circuitry of FIG. 1, in accordance with one embodiment of the present invention.

FIG. 2 illustrates, in flow diagram form, a method 200 of performing scan testing of clock generation circuitry 142, in accordance with one embodiment of the present invention. Method 200 begins with a reset in block 202. In block 204, the control registers in BIST controller 130 (e.g. pattern count register and shift length register) can be set or programmed to the desired values. In one embodiment, the pattern count refers to the number of patterns which are provided to the scan chains prior to obtaining a final output signature from MISR 140, with their respective capture cycles, and the shift length refers to the number of clock cycles required to load the chains for each pattern. In block 206, scan_en is asserted so as to enable the shift clock. The shift clock is provided via MUXes 126, 110, 116, and 120 to source clock counter 128, programmable clock division logic 112, divided clock counter, and divided clock counter 124, respectively. The shift clock is also provided to LFSR 138 and MISR 140. In one embodiment, the shift clock is generated by BIST controller 130. Next, in block 208, the scan chains are flushed to known values in accordance with the shift clock, in which predetermined values (e.g. zeros) can be shifted in to all the scan chains (e.g. the scan chains S0-Sn). The predetermined values can be provided by LFSR 138 (such as, for example, by forcing all outputs SI0-SIn low) or can be provided by other circuitry instead of LFSR 138.

After all scan chains are flushed, a full shift of a next bit pattern begins in block 210 during a scan phase of the scan test. This bit pattern has a corresponding shift length, and LFSR 138 generates this bit pattern based on a seed received from BIST controller 130. With the received seed, LFSR 138 generates the next pseudo-random number in accordance with the shift clock, providing one bit for each of SI0-SIn. These bits are shifted into the corresponding scan chains. Also at this time, a bit for each of SO0-SOn is shifted out of the corresponding scan chains and provided to MISR 140, which generates the next signature based on its previous signature value and the received bits in accordance with the shift clock. Therefore, in bock 212 (during the scan phase), the scan chains receive the next input shift bit from LFSR 138 and provide the next output shift bit to MISR 140 in accordance with the shift clock. At decision diamond 214 it is determined whether the full shift length for the current pattern is complete. If the shift length number of bits has not yet been provided to the scan chains, method 200 returns to block 212 such that the scan chain can receive the next input bit while providing the next output bit in accordance with the next pulse of the shift clock.

Upon finishing the full shift of the pseudo randomly generated test pattern, note that each of source clock counter 128, divided clock counter 118, and divided clock counter 124 is loaded with random values as an initial count value from which counting will begin. Similarly, clock configuration registers 113 will be loaded with random values so as to randomly configure programmable clock division logic 112. At decision diamond 214, after the shift length number of bits have been processed such that the full shift of the current test pattern is complete, at block 216, BIST controller 130 negates scan_en to disable the shift clock (thus ending the current scan phase).

Next, at decision diamond 218, it is determined whether the test pattern count has been completed. For example, the pattern count stored in BIST controller 130 indicates how many patterns are processed (i.e. tested) to form the final output signature. At decision diamond 218, BIST controller 130 compares the pattern count stored in BIST controller 130 to the number of patterns which have been fully shifted in and tested. If the number of test patterns has not reached the pattern count, then, in block 224, BIST controller 130 asserts atspeed_en in order to provide PLL 102 (at the output of MUX 106) as the capture clock for the subsequent capture phase of the scan test. During the capture phase, clock generation circuitry 142 and clock counters 128, 118, and 124 are configured to operate functionally (rather than as scan chains). (In alternate embodiments, one of other clock source 104 can instead be selected as the capture clock.)

With PLL 102 being selected as the capture clock and with atspeed_en asserted to a logic level one, clock gating element 108 is enabled to provide PLL 102 at its GCK output. With scan_en negated to a logic level zero, PLL 102 at the GCK output of clock gating element 108 is provided via MUX 126 to the input of source clock counter 128. With each clock pulse of PLL 102 (in which either the rising or the falling edge of the clock pulse can be the active edge counted by the counter), source clock counter 128 increments the count value by a predetermined count value (e.g. one). Note that source clock counter 128, upon the start of the capture clocks, starts incrementing from the random value which was loaded as the initial count value as a result of the shifting in of test bits generated by LFSR 138. Similarly, PLL 102 at the output of clock gating element 108 is provided to programmable clock division logic 112, which is configured in accordance to the random values in configuration registers 113. Programmable clock division logic 112 outputs a clock signal to divided clock counter 118 via MUX 116 and a clock signal to divided clock counter 124 via MUX 122 (each in accordance with the random configuration of registers 113). These clocks count each received clock pulse (in which either the rising or the falling edge of the clock pulse can be the active edge counted by the counter), in which each counter starts incrementing its count value from the random value loaded as the initial count value during the shifting in of the test pattern.

In block 226 of method 200, source clock counter 128 counts pulses of the capture clock (PLL 102) until source clock counter 128 surpasses its maximum count value, at which point source clock counter 128 achieves a counter overflow condition and asserts the counter overflow indicator to a logic level one. The assertion of the counter overflow indicator indicates to BIST controller 130 that the current capture phase of the scan test is complete. In this manner, during the capture phase, there is a deterministic number of clock pulses (e.g. of PLL 102) that is allowed to be fed to clock division logic 112, as determined by source clock counter 128, based on the random value loaded as its initial count value and its maximum count value.

Upon source clock counter 128 asserting the overflow indicator, atspeed_en is negated in block 228 to again disable PLL 102 (such that the GCK output of clock gating element 108 is held at a logic level low), and scan_en is asserted to again enable the shift clock for a next scan phase. Method 200 then returns to block 210 to begin the full shift of a next test pattern. Note that as the next test pattern is shifted in to each scan chain (from the test bits generated by LFSR 138 based on a next seed value), the output of each scan chain is shifted out. In the case of the counters, the shifted out scan chain values correspond to the resulting count values of the counters as a result of the previous capture clock cycles. The next scan phase for the next pattern (and the subsequent capture phase) continues as was described above.

If, at decision diamond 218, the test pattern count has been completed, method 200 proceeds to block 220, in which the final MISR output signature is provided to BIST controller 130 by MISR 140 and stored in the MISR_Reg. For example, if the pattern count is 1000 patterns, then 1000 patterns are shifted in using the shift clock, each in a corresponding scan phase, in which each scan phase is followed by a corresponding capture phase using the capture clock. A length of each capture phase is determined by source clock counter 128, in which each capture phase ends after source clock counter 128 has achieved an overflow condition. Therefore, with a pattern count of 1000, there are 1000 scan phase/capture phase pairs performed to provide a final output signature from MISR 140. The final output signature can then be compared with an expected final signature, obtained from seeds and signatures storage circuitry 136. If the final output signature matches the expected signature, the scan test succeeds. However, if there is not a match, the scan test fails, indicating an error, such as a stuck at fault or time delay fault.

In one embodiment, simulations are run with the test patterns generated from the seeds to obtain the corresponding expected signatures. For the simulations, a seed can be provided to the simulated LFSR which, in response, generates a corresponding pattern of a particular number of bits (as determined by the pattern length) for the seed. Any number of seeds can be provided to generate patterns, and after a desired number of patterns, a resulting expected final signature can be recorded. In this manner, as a result of the simulation, seeds and corresponding expected signatures can be generated and stored in storage circuitry 136. In one embodiment, storage circuitry 136 is located outside IC 100, such as on an external tester, which can be accessed by BIST controller 130 through test port 134.

By now it can be appreciated how improved testing of clock generation circuitry can be achieved through BIST with the use of clock counters, clock gating elements, and scan chains, in which scan testing is performed through both scan and capture phases. Note that through the use of the various clock gate elements and MUXes to switch between providing the shift clock for scan phases and the capture clock for capture phases, scan testing can be performed with safe clock transitions. Various aspects of the scan testing, such as the pattern count and shift length, are controllable or programmable, and the events in the scan testing are fully deterministic. Therefore, it is possible to fault grade operation of the clock generation circuitry and obtain a deterministic fault coverage calculation for the clock generation circuitry.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, IC 100 of FIG. 1 may include additional circuitry, such as one or more processing cores, memories, peripherals, etc. Furthermore, IC 100 may include more clock generation circuitry or multiple instances of clock generation circuitry, as needed. Therefore, IC 100 and any exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Also for example, in one embodiment, the illustrated elements of IC 100 are circuitry located on a single integrated circuit or within a same device. Alternatively, IC 100 may include any number of separate integrated circuits or separate devices interconnected with each other. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the counters may be set up differently, such as to decrement rather than increment, or to increment/decrement by other values other than one. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes programmable clock division logic circuitry, wherein the programmable clock division logic circuitry outputs a number of divided clock sources; built-in self-test (BIST) circuitry including: divided clock counter circuitry for each of the divided clock sources, in which the divided clock counter circuitry includes scan chain circuitry through which pseudo random scan patterns are shifted through the scan chain circuitry. The divided clock counter circuitry is configured to: use a shift clock signal during a scan shift mode of operation, use a corresponding one of the divided clock signals during a capture mode of operation, count a number of clock pulses during the capture mode of operation, and output test scan signatures that include scan test results from logic under test during the capture mode of operation. The BIST circuitry also includes a BIST controller configured to determine when a number of the predefined test patterns have been processed by the programmable clock division logic circuitry and compare an expected test signature to a final scan test signature to test logic in the divided clock counter circuitry. In one aspect, the integrated circuit further includes a linear feedback shift register configured to generate the pseudo random scan patterns. In a further aspect, the integrated circuit further includes source clock counter circuitry is configured to count a number of clock signals and provide a counter overflow signal to the BIST controller when a specified number of clock signals is exceeded for each of the pseudo random scan patterns. In a further aspect, the source clock counter circuitry includes scan chain circuitry to test source clock counter logic using one of the pseudo random scan patterns; and the BIST controller is configured to compare another expected test signature to another final scan test signature to test the source clock counter circuitry. In another aspect, the programmable clock division logic circuitry includes scan chain circuitry to test clock division logic using one of the pseudo random scan patterns; and the BIST controller is configured to compare another expected test signature to another final scan test signature to test the programmable clock division logic circuitry. In another aspect of the embodiment, the BIST controller is configured to receive: a pattern count indicating the number of the predefined test patterns; a shift length indicating a number of shifts required to load the scan chain circuitry in divided clock counter circuitry; and the expected test signature. In another aspect, the BIST controller is configured to provide at least one of a group consisting of a random seed, the shift clock signal, and a scan enable signal, to the linear feedback shift register. In yet another aspect, the BIST controller is configured to provide an at-speed enable signal to indicate when to de-assert the counter overflow signal. In yet another aspect of the embodiment, the integrated circuit further includes a multi-input shift register configured to provide a compressed version of the final scan test signature to the BIST controller. In a further aspect, the integrated circuit further includes a first multiplexer including a first input coupled to a clock signal from a phase locked loop (PLL), a second input coupled to an at-speed clock signal, a control input coupled to a clock source select signal, and an output that provides the PLL clock signal or the at-speed clock signal. In yet a further aspect, the integrated circuit further includes a second multiplexer including a first input coupled to the shift clock signal, a second input, a control input coupled to a scan enable signal, and an output coupled to an input of the programmable clock division logic circuitry; and a clock gate circuit configured to receive the output of the first multiplexer and the at-speed enable signal and provide the output of the first multiplexer to the second input of the second multiplexer when the at-speed enable signal is asserted. In yet an even further aspect, the integrated circuit further includes the source clock counter circuitry configured to receive the output of the clock gate circuit when the scan enable signal is not asserted, and to receive the shift clock signal when the scan enable signal is asserted, (Multiplexer) and to provide the counter overflow indicator to the BIST controller.

In another embodiment, an integrated circuit includes a programmable clock division logic circuit configured with a scan chain to test operation of the clock division logic circuit during a test mode of operation and to generate one or more divided clock signals in a non-test mode of operation; one or more divided clock counter logic circuits including scan chain logic to test operation of the divided clock counter logic circuit using the one or more divided clock signals; a shift register configured to generate test patterns for the scan chain logic in the clock division logic circuit and the divided clock counter logic circuit; and a built-in self-test (BIST) controller configured to: generate an indicator to use of a shift clock to shift in the test patterns and use another clock source during a capture phase of the test operations; and, once the test patterns have been shifted into the scan chain logic and the capture phase is complete, compare an expected signature to a final test signature to determine whether the clock division logic and the divided clock counter logic are operating correctly. In one aspect, the integrated circuit further includes a source clock counter circuit configured to generate a counter overflow indicator when a number of the clock cycles of the other clock source exceeds a number of bits in the test patterns. In another aspect, the integrated circuit further includes a multi-input shift register configured to receive scan chain output from the clock division logic and the divided clock counter logic and provide a compressed version of the final test signature to the BIST controller. In another aspect, the source clock counter circuit includes scan chain logic to test operation of the source clock counter circuit.

In yet another embodiment, a method includes generating-pseudo random test pattern bits for scan chain logic in programmable clock division logic circuitry and divided clock counter circuitry; using a shift clock to shift the test pattern bits into the scan chain logic; using a capture clock signal in the programmable clock division logic during a non-test mode; using the shift clock to provide output shift bits from the scan chain logic to a multi-input shift register (MISR); and once all the output shift bits for the test pattern bits are provided to the MISR, comparing a final test signature from the MISR to an expected test signature to determine whether the programmable clock division logic circuitry and divided clock counter circuitry are free of faults. In one aspect, the method further includes generating the test pattern bits for multiple test patterns; and comparing the final test signature for the multiple test patterns to the expected signature. In another aspect, the method further includes generating test pattern bits for scan chain logic in source clock counter circuitry; and, once all the output shift bits for the test pattern bits are provided to the MISR, comparing a final test signature from the MISR to an expected test signature to determine whether the source clock counter circuitry is operating correctly. In a further aspect, the method further includes providing input to the BIST controller, the input including at least one of the group consisting of: a pattern count indicating the number of the predefined test patterns; a shift length indicating a number of shifts required to shift the test pattern bits for each of a number of test patterns into the scan chain logic; and the expected test signature.

What is claimed is:

1. An integrated circuit comprising:
programmable clock division logic circuitry, wherein the programmable clock division logic circuitry outputs a number of divided clock sources;
built-in self-test (BIST) circuitry including:
divided clock counter circuitry for each of the divided clock sources, the divided clock counter circuitry including scan chain circuitry through which pseudo random scan patterns are shifted through the scan chain circuitry, wherein the divided clock counter circuitry is configured to:
use a shift clock signal during a scan shift mode of operation to shift in a pseudo random scan pattern, resulting in storing a random value in the scan chain circuitry,
receive a corresponding one of the divided clock sources during a capture mode of operation,
count a number of clock pulses of the received corresponding one of the divided clock sources during the capture mode of operation, using the random value as an initial count value, and
output test scan signatures that include scan test results during the scan shift mode of operation; and
a BIST controller configured to determine when a number of the predefined test patterns have been processed by the programmable clock division logic circuitry and compare an expected test signature to a final scan test signature to test logic in the divided clock counter circuitry.

2. The integrated circuit of claim 1, further comprising:
a linear feedback shift register configured to generate the pseudo random scan patterns.

3. The integrated circuit of claim 2, further comprising:
source clock counter circuitry configured to, during the capture mode for each of the pseudo random scan patterns, count a number of clock pulses of a capture clock from an initial count value of the source clock counter circuitry and assert a counter overflow signal to the BIST controller when the source clock counter circuitry exceeds its maximum count value, wherein assertion of the counter overflow signal defines completion of the capture mode for each pseudo random scan pattern.

4. The integrated circuit of claim 3, wherein:
the source clock counter circuitry includes scan chain circuitry to test source clock counter logic using one of the pseudo random scan patterns, wherein the scan shift mode results in storing a random value in the scan chain circuitry of the source clock counter circuitry for use during the capture mode of operation as the initial count value of the source clock counter circuitry; and
the BIST controller is configured to compare another expected test signature to another final scan test signature to test the source clock counter circuitry.

5. The integrated circuit of claim 1, wherein:
the programmable clock division logic circuitry includes configuration registers configured as scan chain circuitry during the scan shift mode to test clock division logic using one of the pseudo random scan patterns, the programmable clock division logic circuitry configured to:
during the scan shift mode, shift in random values into the configuration registers configured as scan chain circuitry of the programmable clock division logic circuitry, and
during the capture mode, generate each divided clock source in accordance with a random configuration of the programmable clock division logic circuitry due to the random values shifted into the configuration registers during the scan shift mode.

6. The integrated circuit of claim 1, wherein:
the BIST controller is configured to receive:
a pattern count indicating the number of the predefined test patterns;
a shift length indicating a number of shifts required to load the scan chain circuitry in divided clock counter circuitry; and
the expected test signature.

7. The integrated circuit of claim 2, wherein:
the BIST controller is configured to provide at least one of a group consisting of a random seed, the shift clock signal, and a scan enable signal, to the linear feedback shift register.

8. The integrated circuit of claim 3, wherein:
the BIST controller is configured to provide an at-speed enable signal to indicate when to de-assert the counter overflow signal.

9. The integrated circuit of claim 1, wherein:
a multi-input shift register (MISR) configured to provide a compressed version of the final scan test signature to the BIST controller.

10. The integrated circuit of claim 8, further comprising:
a first multiplexer including a first input coupled to a clock signal from a phase locked loop (PLL), a second input coupled to an at-speed clock signal, a control input coupled to a clock source select signal, and an output that provides the PLL clock signal or the at-speed clock signal.

11. The integrated circuit of claim 10, further comprising:
a second multiplexer including a first input coupled to the shift clock signal, a second input, a control input coupled to a scan enable signal, and an output coupled to an input of the programmable clock division logic circuitry; and
a clock gate circuit configured to receive the output of the first multiplexer and the at-speed enable signal and provide the output of the first multiplexer to the second input of the second multiplexer when the at-speed enable signal is asserted.

12. The integrated circuit of claim 11, wherein:
the source clock counter circuitry is configured to receive the output of the clock gate circuit when the scan enable signal is not asserted, and to receive the shift clock signal when the scan enable signal is asserted, wherein the output of the clock gate circuit is provided as the capture clock during the capture mode.

13. An integrated circuit comprising:
a programmable clock division logic circuit having a set of configuration registers configured as a scan chain to test operation of the clock division logic circuit during a test mode of operation, the programmable clock division logic configured to generate one or more divided clock signals in accordance with a configuration stored in the set of configuration registers;

one or more divided clock counter logic circuits including scan chain logic to test operation of the divided clock counter logic circuit using the one or more divided clock signals;

a shift register configured to generate test patterns for the scan chain logic in the clock division logic circuit and the divided clock counter logic circuit;

a built-in self-test (BIST) controller configured to:
generate an indicator to use a shift clock to shift in the test patterns during a shift phase of the test mode of operation and use another clock source during a capture phase of the test mode of operation, and once the test patterns have been shifted into the scan chain logic and the capture phase is complete, compare an expected signature to a final test signature to determine whether the clock division logic and the divided clock counter logic are operating correctly; and a source clock counter circuit configured to assert a counter overflow indicator when a number of the clock cycles of the other clock source during the capture phase exceeds its maximum count value, wherein the source clock counter circuitry includes a scan chain, wherein the scan phase results in storing a random value in the scan chain of the source clock counter circuitry which is used during the capture phase as an initial count value of the source clock counter circuitry, wherein assertion of the counter overflow indicator indicates completion of the capture phase.

14. The integrated circuit of claim 13, wherein:
the programmable clock division logic circuitry is configured to:
during the scan phase, shift in random values into the configuration registers, and
during the capture phase, generate the one or more divided clock signals in accordance with a random configuration due to the random values shifted into the set of configuration registers during the scan phase.

15. The integrated circuit of claim 13, further comprising:
a multi-input shift register (MISR) configured to receive scan chain output from the programmable clock division logic circuit and the one or more divided clock counter logic circuits and provide a compressed version of the final test signature to the BIST controller.

16. The integrated circuit of claim 14, wherein:
the one or more divided clock counter logic circuits each include a corresponding scan chain and each is configured to receive a corresponding divided clock signal of the one or more divided clock signals, each of the one or more divided clock counter logic circuits configured to:
during the scan phase, shift a corresponding random value into the corresponding scan chain, and during the capture phase, count a number of clock pulses of the received corresponding divided clock signal using the corresponding random value stored in the corresponding scan chain as an initial count value.

17. A method comprising:
generating-pseudo random test pattern bits for scan chain logic in programmable clock division logic circuitry and divided clock counter circuitry;

using a shift clock to shift the test pattern bits into the scan chain logic during a shift mode, wherein a configuration register of the programmable clock division logic circuitry and a count value storage element of the divided clock counter circuitry are configured as part of the scan chain logic during the shift mode;

using a capture clock signal in the programmable clock division logic during a capture phase to generate a divided clock from the capture clock in accordance with a random clock division configuration stored in the configuration register resulting from the shift phase;

during the capture phase, counting pulses of the divided clock generated from the capture clock by the divided clock counter circuitry using a random initial count value stored in the count value storage element resulting from the shift phase;

using the shift clock to provide output shift bits from the scan chain logic to a multi-input shift register (MISR), during the shift phase;

once all the output shift bits for the test pattern bits are provided to the MISR, comparing a final test signature from the MISR to an expected test signature to determine whether the programmable clock division logic circuitry and divided clock counter circuitry are free of faults.

18. The method of claim 17 further comprising:
generating the test pattern bits for multiple test patterns; and
comparing the final test signature for the multiple test patterns to the expected signature.

19. The method of claim 17 further comprising:
generating test pattern bits for scan chain logic in source clock counter circuitry; and
once all the output shift bits for the test pattern bits are provided to the MISR, comparing a final test signature from the MISR to an expected test signature to determine whether the source clock counter circuitry is operating correctly.

20. The method of claim 19, further comprising:
providing input to the BIST controller, the input including at least one of the group consisting of:
a pattern count indicating the number of the predefined test patterns;
a shift length indicating a number of shifts required to shift the test pattern bits for each of a number of test patterns into the scan chain logic; and
the expected test signature.

* * * * *